United States Patent [19]
Troyanovsky

[11] Patent Number: 5,666,367
[45] Date of Patent: Sep. 9, 1997

[54] METHOD FOR SIMULATING A CIRCUIT

[75] Inventor: Boris Troyanovsky, San Francisco, Calif.

[73] Assignee: Hewlett-Packard Company, Palo Alto, Calif.

[21] Appl. No.: 745,976

[22] Filed: Nov. 8, 1996

[51] Int. Cl.⁶ ........................................................ S06F 11/00
[52] U.S. Cl. ................................................................ 371/22.1
[58] Field of Search ........................... 371/22.1, 23, 25.1, 371/26, 27, 28; 395/183.01, 183.09, 183.13

[56] References Cited

PUBLICATIONS

"Efficient Multi-Tone Distortion Analysis of Analog Integrated Circuits", by R. Melville, P. Feldmann, and J. Roychowdhury; Proceedings of the 1995 IEEE Custom Integrated Circuits Conference, May, 1995; pp. 241–244.

*Primary Examiner*—Vincent P. Canney

[57] ABSTRACT

A method for simulating the response of a circuit to one or more stimulating signals using a digital computer. The circuit is represented by N nodes, where N is an integer greater than 1. Each of the nodes is connected to one or more devices, each device being represented by a computer routine that provides the current sourced by that device at each frequency, $\omega_h$, when the nodes are held at a set of potentials represented by $$x_n(t) = \sum_{h=-H}^{H} X_{n,h} e^{j\omega_h t},$$

where $X_{n,-h}=X^*_{n,h}$, n runs from 1 to N, and H is an integer greater than 0. The method determines the values of the $X_{n,h}$ by iteratively computing a new estimate for $X=[X_{10}, \ldots, X_{1H}, X_{20}, \ldots, X_{2H}, \ldots, X_{N0}, \ldots X_{NH}]$ from a previous estimate for X. The estimates for X are based on the values of $F_{nh}$, for n from 1 to N and h from 0 to H, where $F_{nh}$ is the net current flowing into node n for frequency $\omega_h$. Each iteration includes four steps. In the first step, a subset of frequencies is selected for each of the nodes. In the second step, $F_{nh}$, for n from 1 to N and h from 0 to H is computed. In the third step, the partial derivatives of $F_{np}$ with respect to $X_{jk}$ where n,j run for 1 to N and p, k are restricted to those values of h for which $\omega_h$ is in the subset of frequencies are computed. Finally, an updated value for each $X_{np}$ for which $\omega_p$ is included in the subset of frequencies at node n is computed.

7 Claims, 1 Drawing Sheet

METHOD FOR SIMULATING A CIRCUIT

FIELD OF THE INVENTION

The present invention relates to computer programs for simulating electronic circuits.

BACKGROUND OF THE INVENTION

The complexity of modern integrated circuits and the high cost of fabricating prototypes has led to the development of a class of computer programs that simulate the operation of a circuit. These simulators aid the designer in determining the proper bias voltages to be applied to the various components and in verifying the operation of the circuit before resources are committed to the fabrication of prototypes.

The circuit to be simulated is typically described in terms of a list of nodes and the components connected to each node. The user may actually provide a net list or a graphical representation of the circuit from which the program derives the net list. Each component may be viewed as a device that sources or sinks a current whose amplitude and phase are determined by the voltage at the node to which it is connected, and possibly, by the previous voltages at the node in question. The user may define particular components or utilize a library of standard components provided with the simulation program.

The simulation program finds the set of node voltages that lead to a circuit in which the sum of the currents at each node is zero. This is the voltage at which the currents provided by components that are the source of currents is exactly matched by the currents sinked by the remaining components. Each component is described by a subroutine that provides the current sinked or sourced by the component in response to an input voltage. As will be explained in more detail below, the component subroutines may also provide the first derivatives of the current with respect to the node voltages. In addition, the output of a component subroutine may depend on the history of the node to which the corresponding component is connected. For example, if the component contains inductors or capacitors, than the current will depend on the node voltage and the rate of change of the node voltage with time. The rate of change of the node voltage may be computed from the previous values of the node voltages, i.e., the "history of the nodes".

The simplest type of simulation determines the steady state behavior of the circuit, i.e., its DC operating conditions. Such simulations are particularly useful in setting various bias voltages on key nodes in the circuit. Under steady-state conditions, the solution of the simulation problem typically reduces to the inversion of an N×N matrix, where N is the number of nodes in the circuit.

The simulation of the circuit under AC operating conditions is substantially more complex. Typically, the designer wishes to determine the voltage as a function of time at one or more nodes in the circuit when an input node is connected to a voltage source that varies with time. As noted above, one or more of the circuit components will sink or source currents whose amplitude and phase depend on the rate of change of the node voltage as well as the node voltage itself. Hence, the requirement that the currents entering a node are balanced by the currents leaving the node leads to system of differential equations. A circuit having N nodes is now described by an N×N system of differential equations.

Numerical methods for solving such systems of differential equations are known. These methods typically require an iterative process at each time point. Each iteration involves the inversion of an N×N matrix. Hence, the numerical difficulty of predicting the node voltages at any given time is many times greater than that of a simple DC simulation.

Furthermore, the solution must be repeated at each time point. The spacing of the time points is typically determined by the highest frequency expected at any node having a component connected thereto whose output depends on the rate of change of the node voltage, i.e., the first derivative of the node voltage. The first derivative is determined by fitting the current node voltage and one or previous node voltages to a curve. The slope of the curve is then used as an approximation to the first derivative. If successive time points are too far apart, the approximation will lead to a significant error in the first derivative. It should be noted that such an error is equivalent to making an error in an inductor or capacitor value in the circuit. Hence, simulations of transients will have an error that increase with the time step size. Thus, the required number of steps per second may be an order of magnitude higher than the highest frequency at the most sensitive node.

Consider a simulation in which the input signal to the circuit is a 10 kHz modulation of a 10 gHz microwave signal. To view the circuit response over 10 cycles of the modulation envelop, i.e., one millisecond, with a step size equal to one tenth the period of the carrier, the circuit behavior must be computed at 100 million time points. If the behavior at each of 1000 nodes is to be recovered, the storage space for the results alone becomes a problem.

If the input wave form is periodic, the computational difficulty can be substantially reduced using harmonic balancing methods for computing the behavior of the circuit. In this case, the input signal may be written as a sum of sinusoids having fixed amplitudes. Each circuit component must provide the current sourced or sinked by that component in response to each of the sinusoids at the node connected to the component. If the input signal is represented by 10 sinusoids, the component must provide 10 current values plus the currents at harmonics of these values. It should be noted that each current is a complex number representing the current's amplitude and phase. The currents at the harmonics are needed because a non-linear device may excite one or more harmonics of an input signal. The simulation problem is then reduced to solving a set of non-linear equations in which the currents entering and leaving each node at each frequency are balanced.

The Harmonic Balance technique provides its advantages by eliminating the need to compute solutions at each time point. In this case, the solution of the HN complex non-linear equations provides the steady state solution to the simulation problem. Here, H is the number of harmonics for which each device must provide current data. The difficulty of solving the Harmonic Balance equations, however, limits the method to circuits and waveforms for which the solution of HN non-linear equations can be accomplished.

The traditional approach to solving the Harmonic Balance equations utilizes the Newton-Raphson method for solving non-linear systems of equations. This system requires the solution of an HN by HN matrix which is normally accomplished by LU factorization. This method is not efficient for large systems of equations, since the memory required to factor the matrix rises as $O(H^2)$ and the computational workload rises as $O(H^3)$.

Various relaxation approaches to solving the Harmonic Balance equations have been proposed to reduce the memory requirements. While these methods significantly reduce the amount of memory needed to compute a solution, these method have not gained widespread use because of poor convergence behavior, particularly when the devices at one or more of the nodes are non-linear. In contrast, the Newton-Raphson technique has very rapid convergence near the solution.

Broadly, it is the object of the present invention to provide an improved method for simulating an electronic circuit on a computer.

It is a further object of the present invention to provide a simulator that requires less memory than the Newton-Raphson technique when the current guess is far from the solution.

It is yet another object of the present invention to provide a simulator that imposes a smaller computational workload than the Newton-Raphson method.

These and other objects of the present invention will become apparent to those skilled in the art from the following detailed description of the invention and the accompanying drawings.

SUMMARY OF THE INVENTION

The present invention is a method for simulating the response of a circuit to one or more stimulating signals using a digital computer. The circuit is represented by N nodes, where N is an integer greater than 1. Each of the nodes is connected to one or more devices, each device being represented by a computer routine that provides the current sourced by that device at each frequency, $\omega_h$, when the nodes are held at a set of potentials represented by $$x_n(t) = \sum_{h=-H}^{H} X_{n,h} e^{j\omega_h t},$$

where $X_{n,-h}=*X_{n,h}$, n runs from 1 to N, and H is an integer greater than 0. The method determines the values of the $X_{n,h}$ by iteratively computing a new estimate for $X=[X_{10}, \ldots, X_{1H}, X_{20}, \ldots, X_{2H}, \ldots, X_{N0}, \ldots, X_{NH}]$ from a previous estimate for X. The estimates for X are based on the values of $F_{nh}$, for n from 1 to N and h from 0 to H, where $F_{nh}$ is the net current flowing into node n for frequency $\omega_h$. Each iteration includes four steps. In the first step, a subset of frequencies is selected for each of the nodes. In the second step, $F_{nh}$, for n from 1 to N and h from 0 to H is computed. In the third step, the partial derivatives of $F_{np}$ with respect to $X_{jk}$ where n,j run for 1 to N and p, k are restricted to those values of h for which $\omega_h$ is in the subset of frequencies are computed. Finally, an updated value for each $X_{np}$ for which $\omega_p$ is included in the subset of frequencies at node n is computed.

DETAILED DESCRIPTION OF THE PREFERRED EMBODIMENTS OF THE INVENTION

Figure 1:
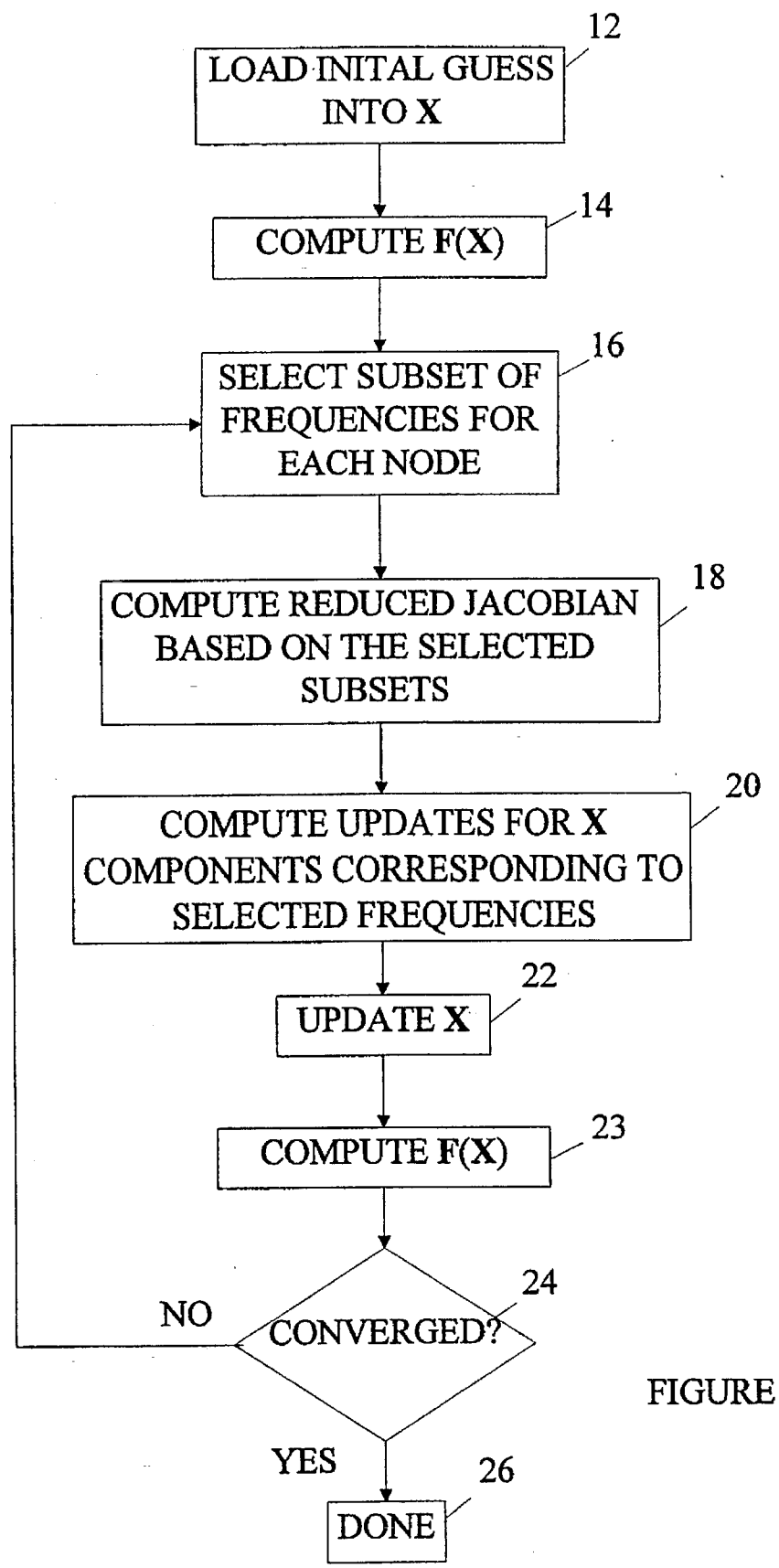
FIG. 1 is a flow chart for the basic iteration process used in the present invention.

The present invention may be more easily discussed in terms of the following notation. At node n, the current balancing equations may be written in the form $$r_n(x(t)) + \frac{d}{dt} q_n(x(t)) - u_n(t) = 0 \tag{1}$$

Here, the vector x(t) has components $[x_1, \ldots x_N]$ where $x_n(t)$ is the voltage as a function of time at the $n^{th}$ node, $r_n$ is a non-linear reistive current, $q_n$ is a non-linear charge function, and $w_n$ is the driving current at that node, if one exists. There are N such equations, one per node. The Harmonic Balance method replaces $x_n(t)$ by a quasi-Fourier series of the form $$x_n(t) = \sum_{h=-H}^{H} X_{n,h} e^{j\omega_h t} \tag{2}$$

where $X_{n,-h}=X^*_{n,h}$ and the frequencies, $\omega_h$, need not be harmonically related. The set of frequencies must be chosen large enough that the energy in any neglected frequencies is minimal. If the stimulating signals applied to the circuit are sinusoidal, then at least some of the $\omega_h$ will be the frequencies of these stimulating signals and the harmonics thereof. This formulation of $x_n(t)$ reduces the set of differential equations shown above to a set of non-linear equations of the form $$F_{nh}(X_{00} \ldots X_{NH})=R_{nh}(X_{00} \ldots X_{NH})+j\omega_h Q_{nh}(X_{00} \ldots X_{NH})-U_{nh},$$
$$0 \leq h \leq H \tag{3}$$

The goal of the circuit simulation program is to find the values $(X_{00} \ldots X_{NH})$ such that $$F_{nh}(X_{00} \ldots X_{NH})=0 \tag{4}$$

for all values of n and h. To simplify the notation used in the following discussion, the values of $F_{nh}$ and $X_{nh}$ may be viewed as vectors. To distinguish vectors and matrices from scalar quantities, symbols representing vectors and matrices will be shown in bold print. Thus, $$F=[F_{10}, \ldots, F_{1H}, F_{20}, \ldots, F_{2H}, \ldots, F_{N0}, \ldots F_{NH}] \tag{5}$$

and $$X=[X_{10}, \ldots, X_{1H}, X_{20}, \ldots, X_{2H}, \ldots, X_{N0}, \ldots X_{NH}] \tag{6}$$

The most commonly used method for solving Eq. (4) is the Newton-Raphson technique. This technique exhibits convergence that is locally quadratic, and hence, converges rapidly near the solution. The technique is an iterative method in which the $(i+1)^{st}$ approximation for X, denoted by $^{(i+1)}X$, is calculated from the $^iX$ by the relationship:

$$^{i+1}X = {}^iX - \left(\frac{\partial F}{\partial X}\right)^{-1_i} F \tag{7}$$

Here, $(\partial F/\partial X)^{-1}$ denotes the inverse of the Jacobian matrix. Because both F and X are vectors of complex quantities, the Jacobian elements are 2×2 matrices of the form $$\begin{bmatrix} \frac{\partial F_{nh,re}}{\partial X_{kj,re}} & \frac{\partial F_{nh,re}}{\partial X_{kj,im}} \\ \frac{\partial F_{nh,im}}{\partial X_{kj,re}} & \frac{\partial F_{nh,im}}{\partial X_{kj,im}} \end{bmatrix} \tag{8}$$

Here, $F_{nm,re}$ and $F_{nm,im}$ are the real and imaginary parts of $F_{nm}$, respectively. Similarly $X_{kj,re}$ and $X_{kj,im}$ are the real and imaginary parts of $X_{kj}$, respectively. The Jacobian matrix consists of a sparse N×N collection of rectangles, denoted by $J_{nm}$, where $$J_{nm} = \begin{bmatrix} \frac{\partial F_{n0}}{\partial X_{m0}} & \frac{\partial F_{n0}}{\partial X_{m1}} & \cdots & \frac{\partial F_{n0}}{\partial X_{mH}} \\ \frac{\partial F_{n1}}{\partial X_{m0}} & \frac{\partial F_{n1}}{\partial X_{m1}} & \cdots & \frac{\partial F_{n1}}{\partial X_{mH}} \\ \cdot & \cdot & & \cdot \\ \cdot & \cdot & & \cdot \\ \cdot & \cdot & & \cdot \\ \frac{\partial F_{nH}}{\partial X_{m0}} & \frac{\partial F_{nH}}{\partial X_{m1}} & \cdots & \frac{\partial F_{nH}}{\partial X_{mH}} \end{bmatrix} \quad (9)$$

Here, each element is a 2×2 matrix of the form (8).

The quantities $F_{nh}$ will be referred to as the solution residuals in the following discussion. These quantities represent the extent to which the present estimate of X fails to meet the circuit criteria for the $n^{th}$ node of the circuit and the $h^{th}$ harmonic, i.e., the extent to which the current flowing into node n at harmonic h is balanced by the current at harmonic h leaving node n.

The computational workload inherent in computing the inverse of the Jacobian matrix is $O(H^3N^\alpha)$, since the Jacobian is a sparce matrix. Here, $1<\alpha<3$; hence, the workload inherent in computing one step in the Newton method iteration increases rapidly with the number of circuit nodes and the number of harmonics. The present invention gains its advantages by utilizing a subset of the harmonics at each node when the solution is far from the final solution. Since the workload is proportional to $H^3$, reducing the number of harmonics that must be considered at each iteration by a factor of two reduces the workload by a factor of 8.

The present invention reduces the number of harmonics that are considered at each iteration by selecting a subset of the harmonics at each node. The subset chosen at any given circuit node will, in general, vary from node to node. The manner in which the subset is chosen will be discussed in more detail below. Denote the subset of the harmonics that will be updated at the next iteration for the $n^{th}$ circuit node by $W_n$. The number of harmonics in $W_n$ will be denoted by $\sigma(W_n)$ which is an integer less than or equal to H+1.

At any given iteration, an update is computed for the subsets based on the current approximation for all of the variables, i.e., $^iX$. In general, $$^{(i+1)}X = {^iX} - {^i\Delta X} \quad (10)$$

The update vector $^i\Delta X$, has components that are set to 0 for those harmonics not in one of the subsets. The updates for the harmonics that are contained in one of the subsets are computed by forming a new system of nonlinear equations from the full set of equations represented by Eq. (4) in which only the $X_{ij}$ values for which $X_{ij}$ is in one of the subsets are considered as "unknowns". The remaining $X_{ij}$ values are set at the current estimate $^iX_{ij}$ and treated as being constants. Denote the new reduced system of equations by $F^w(X^w)$. This system of equations will have a dimension equal to $$\sum_{n=1}^{N} \sigma(W_n).$$

An update vector $\Delta X^w$ is then computed for the reduced system of equations using Newton's method, i.e., $$\Delta X^w = -\left(\frac{\partial F^w}{\partial X^w}\right)^{-1} {^iF^w} \quad (11)$$

The Jacobian matrix for the reduced system consists of a sparse N×N collection of rectangles, where each rectangle has dimensions of $\sigma(W_n) \times \sigma(W_m)$. For example, consider the case in which $W_n = \{0,2,8\}$ and $W_m = \{0,3,5,6\}$. The corresponding rectangle in the Jacobian will be $$J^w_{nm} = \begin{bmatrix} \frac{\partial F_{n0}}{\partial X_{m0}} & \frac{\partial F_{n0}}{\partial X_{m3}} & \frac{\partial F_{n0}}{\partial X_{m5}} & \frac{\partial F_{n0}}{\partial X_{m6}} \\ \frac{\partial F_{n2}}{\partial X_{m0}} & \frac{\partial F_{n2}}{\partial X_{m3}} & \frac{\partial F_{n2}}{\partial X_{m5}} & \frac{\partial F_{n2}}{\partial X_{m6}} \\ \frac{\partial F_{n8}}{\partial X_{m0}} & \frac{\partial F_{n8}}{\partial X_{m3}} & \frac{\partial F_{n8}}{\partial X_{m5}} & \frac{\partial F_{n8}}{\partial X_{m6}} \end{bmatrix} \quad (12)$$

The iteration process is summarized in FIG. 1 which is a flow chart of the iteration scheme discussed above. The process is started by loading an initial guess for X as shown at 12. Next, the residual vector F(X) is computed as shown at 14. Based on the values of F(X), the reduced harmonic sets are selected as shown at 16. The reduced harmonic sets are then used to compute the reduced Jacobian as shown at 18. An update vector, $\Delta X^w$, is then computed from the inverse of the reduced Jacobian as shown at 20. The update vector is then used to update X as shown at 22. The updated values for the full set of residuals are then computed as shown at 23. If the process has converged, i.e., the absolute value of each of the residuals is less than some predetermined value, the process is done. If not, a new set of reduced harmonics is chosen and the process is repeated.

The above discussion assumed that a procedure existed for choosing the subsets of harmonics based on the current values of the residuals. The number of harmonics that are active at any node may be fixed by the user, or computed at each iteration by the simulator to optimize speed, convergence, and memory usage. A hybrid of these two approaches may also be used. In the hybrid approach, the minimum number of harmonics to be used at each node is fixed by the user. A floating subset is then selected by the simulator. The harmonics in the minimum set typically include harmonics which the circuit designer anticipates will be particularly important at each node.

The simplest subset selection algorithm assigns the same number of harmonics to be used at each node. Given the current estimate, $^iX$, the full set of residuals is computed and a spectral error norm, $e_h$, determined therefrom, i.e., $$e_h = \sum_{n=1}^{N} |F_{nh}(^iX)| \quad (13)$$

Any harmonics that are specified as fixed by the circuit designer are automatically included in each subset. Any remaining entries in each of the subsets are filled with harmonics having the highest $e_h$ values that have not already been included in the subset as fixed harmonics. In this scheme, all of the subsets have the same number of harmonics, $\sigma$, and the Jacobian blocks will all be square. While the error norms given in Eq. (13) are preferred, it will be apparent to those skilled in the art that other functional relationships may be used to order the frequencies by the degree to which the present estimate for $X_{nh}$ minimizes the residuals at each of the frequencies.

Another method for selecting the subsets of harmonics is to allow the number of harmonics in each subset to vary from node to node in the circuit. Once again, the fixed harmonics are included at each node and then the remaining positions in the subset are filled with the harmonics having the highest error values. The number of harmonics at each node may be specified by the circuit designer. Alternatively, the designer may specify the size of a floating set that is to be filled according to the error function after the fixed harmonics are assigned. This algorithm is preferred when some knowledge exists of harmonics at the various nodes will couple to each other.

In principle, the subset size may be selected automatically. The window size must be selected to balance several competing factors. The subset size must be constrained to be below a certain maximum value so that the reduced Jacobian matrix fits into memory. However, the subset size should typically be above a minimum value to obtain convergence. In addition, the speed at which the algorithm converges can depend critically on the choice of subset size.

The upper bound is perhaps most straightforward to determine, since a maximum size for the Jacobian can be roughly estimated from the amount of RAM in the machine, the operating system overhead, and the size of other simulator memory requirements. The optimal value from a speed/convergence standpoint is more difficult to determine, and must be done iteratively as the simulation proceeds.

An initial "guess" for the subset size, σ, to be applied at all nodes can either be directly supplied by the user, or picked by a heuristic algorithm (e.g., maximum size at which the Jacobian fits into the RAM, some default fraction of H, etc.). The total time for a single iteration depends on both H and σ, and is dominated by two steps shown in FIG. 1: the time to evaluate the residuals, and the time to compute the inverse of the reduced Jacobian. The value of H primarily determines the first of these times, $T_{load}$, while σ determines the second of these times, $T_{inv}$.

As σ is reduced, each iteration takes less time. However, since precisely σ harmonics are updated during the iteration, the number of total iterations necessary for convergence will rise. A value of σ which is too small will result in an excessively large number of iterations, and although $T_{inv}$ will drop significantly, $T_{load}$ will stay the same. Thus, the total solution time will rise. Likewise, a value of σ that is too large will cause $T_{inv}$ to increase roughly as $\sigma^3$, thereby also increasing overall simulation time.

Running benchmarks on several representative circuits has shown that the window size σ should be selected with the goal of having $1 \leq \alpha \leq 6$, where $\alpha = T_{inv}/T_{load}$ While the present invention provides superior performance when the current estimate for X is far from the solution of Eq. (4), it does not always display the quadratic convergence of the Newton method near the solution. Hence, at some point in the iteration process, the full Newton method may become the preferred method for obtaining the next step. The Newton steps are preferably performed via Krylov subspace methods. Since these methods are well known to those skilled in the art, they will not be discussed in detail here. The reader is referred to R. Melville, P. Feldmann, and J. Roychowdhury, "Efficient Multi-Tone Distortion Analysis of Analog Integrated Circuits", Proceedings of the 1995 IEEE Custom Integrated Circuits Conference, May, 1995, which is hereby incorporated by reference, for a more detailed description of the methods.

Various modifications to the present invention will become apparent to those skilled in the art from the foregoing description and accompanying drawings. Accordingly the present invention is to be limited solely by the scope of the following claims.

What is claimed is:

1. A method for simulating the response of a circuit to one or more stimulating signals using a digital computer, said circuit being represented by N nodes, where N is an integer greater than 1, each said node being connected to one or more devices, each device corresponding to a computer routine that provides the current sourced by that device at each frequency, $\omega_h$, when said nodes are held at a set of potentials represented by $$x_n(t) = \sum_{h=-H}^{H} X_{n,h} e^{j\omega_h t},$$

where $X_{n,-h} = X^*_{n,h}$, n runs from 1 to N, and H is an integer greater than 0, said method determining the values of the $X_{n,h}$ values by iteratively computing a new estimate for $X = [X_{10}, \ldots, X_{1H}, X_{20}, \ldots, X_{2H}, \ldots, X_{N0}, \ldots, X_{NH}]$ from a previous estimate for X based on $F_{nh}$, for n from 1 to N and h from 0 to H, where $F_{nh}$ is the net current flowing into node n at frequency $\omega_h$, each iteration comprising the steps of:

selecting a subset of frequencies for each of said nodes;

computing $F_{nh}$, for n from 1 to N and h from 0 to H;

computing the partial derivatives of $F_{np}$ with respect to $X_{jk}$ where n,j run for 1 to N and p, k include those values of h for which $\omega_h$ is in said subset of frequencies at node n; and computing an updated value for each $X_{np}$ for which $\omega_p$ is included in said subset of frequencies at node n.

2. The method of claim 1 wherein said step of selecting a subset of frequencies at each of said nodes comprises the steps of:

computing an error value for each of said frequencies, said error values being $F_{nh}$, for n from 1 to N and h from 0 to H, for the previous estimate for X; and determining which frequencies are included in said subsets based on said error values.

3. The method of claim 1 in which the number of frequencies in each of said subsets is the same for all nodes.

4. The method of claim 2 in which each subset includes one or more predetermined frequencies independent of said error values.

5. The method of claim 2 wherein the number of frequencies in each of said subsets is determined by measuring the time needed to compute $F_{nh}$, for n from 1 to N and h from 0 to H, and the time needed to compute said updated values.

6. The method of claim 2 wherein all of said frequencies are included in each of said subsets if the sum of said error values has not decreased after a predetermined number of iterations.

7. The method claim 6 wherein said step of computing an updated value for each $X_{np}$ utilizes Krylov-subspace methods.

* * * * *